(12) United States Patent
Agarwal et al.

(10) Patent No.: US 10,193,536 B2
(45) Date of Patent: Jan. 29, 2019

(54) SHARED KEEPER AND FOOTER FLIP-FLOP

(71) Applicant: INTEL CORPORATION, Santa Clara, CA (US)

(72) Inventors: Amit Agarwal, Hillsboro, OR (US); Steven K. Hsu, Lake Oswego, OR (US); Simeon Realov, Portland, OR (US); Iqbal R. Rajwani, Roseville, CA (US); Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/860,562

(22) Filed: Jan. 2, 2018

(65) Prior Publication Data

US 2018/0145663 A1 May 24, 2018

Related U.S. Application Data

(63) Continuation of application No. 15/247,713, filed on Aug. 25, 2016, now Pat. No. 9,859,876.

(51) Int. Cl.
*H03K 3/3562* (2006.01)
*H03K 3/037* (2006.01)

(52) U.S. Cl.
CPC ....... *H03K 3/3562* (2013.01); *H03K 3/35625* (2013.01); *H03K 3/0372* (2013.01)

(58) Field of Classification Search
CPC . H03K 3/3562; H03K 3/35625; H03K 3/0372
USPC ................................. 327/306, 333
See application file for complete search history.

(56) References Cited

U.S. PATENT DOCUMENTS

| 6,242,958 | B1* | 6/2001 | Fletcher | H03K 3/35625 |
| | | | | 327/201 |
| 6,333,656 | B1 | 12/2001 | Schober | |
| 8,439,118 | B2* | 5/2013 | Myerley | E21B 34/06 |
| | | | | 137/527 |
| 8,742,796 | B2* | 6/2014 | Dally | H03K 3/356139 |
| | | | | 327/51 |
| 9,035,686 | B1* | 5/2015 | Hsu | H03K 3/356104 |
| | | | | 327/203 |
| 9,612,281 | B2* | 4/2017 | Lou | G01R 31/3177 |
| 2008/0084235 | A1 | 4/2008 | Russell et al. | |
| 2015/0249442 | A1 | 9/2015 | Hsu et al. | |

(Continued)

OTHER PUBLICATIONS

International Search Report and Written Opinion from PCT/US/2017/043798 notified Nov. 8, 2017, 11 pgs.

(Continued)

*Primary Examiner* — Dinh T Le
(74) *Attorney, Agent, or Firm* — Green, Howard & Mughal LLP

(57) ABSTRACT

An apparatus is provided which comprises: a clock node; a first inverter having an input coupled to the clock node; a data node; a master latch with a shared p-type keeper coupled to an output of the first inverter, the master latch coupled to the data node; and a slave latch coupled to an output of the master latch, the slave latch having a shared p-type keeper and a shared n-type footer, wherein the shared p-type keeper and the shared n-type footer of the slave latch are coupled to the clock node and the input of the first inverter.

19 Claims, 9 Drawing Sheets

(56) References Cited

U.S. PATENT DOCUMENTS

2016/0164503 A1    6/2016  Kim et al.
2016/0232968 A1    8/2016  August et al.

OTHER PUBLICATIONS

Notice of Allowance dated Aug. 31, 2017 for U.S. Appl. No. 15/247,713.

\* cited by examiner

SHARED KEEPER AND FOOTER FLIP-FLOP

CLAIM OF PRIORITY

This United States Patent Application is a continuation of, and claims priority to, U.S. patent application Ser. No. 15/247,713 entitled "SHARED KEEPER AND FOOTER FLIP-FLOP," filed Aug. 25, 2016, the entire contents of which are incorporated herein by reference.

BACKGROUND

Area-efficient designs for modern microprocessors, DSP's (Digital Signal Processors), SoC's (System-on-Chip) in wearables, IoTs (Internet-of-Things), smartphones, tablets, laptops, and servers, etc., are increasingly becoming a critical factor due to the following requirements: reducing silicon cost, decreasing PCB (Printed Circuit Board) footprint, improving time-to-market (TTM), and slower scaling cadence of process technology node. These requirements all need to be met while meeting the stringent frequency and/or performance targets and power/leakage budgets.

A major component of the power dissipation in digital systems is due to charging and discharging load capacitance of circuit nodes, otherwise known as dynamic power. In today's clocked synchronous systems—microprocessors, DSP's, and SoC's in smartphones, tablets, laptops, and servers, a large percentage of the overall power dissipation (e.g., greater than 30%) is in the clock grid and final sequential load.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
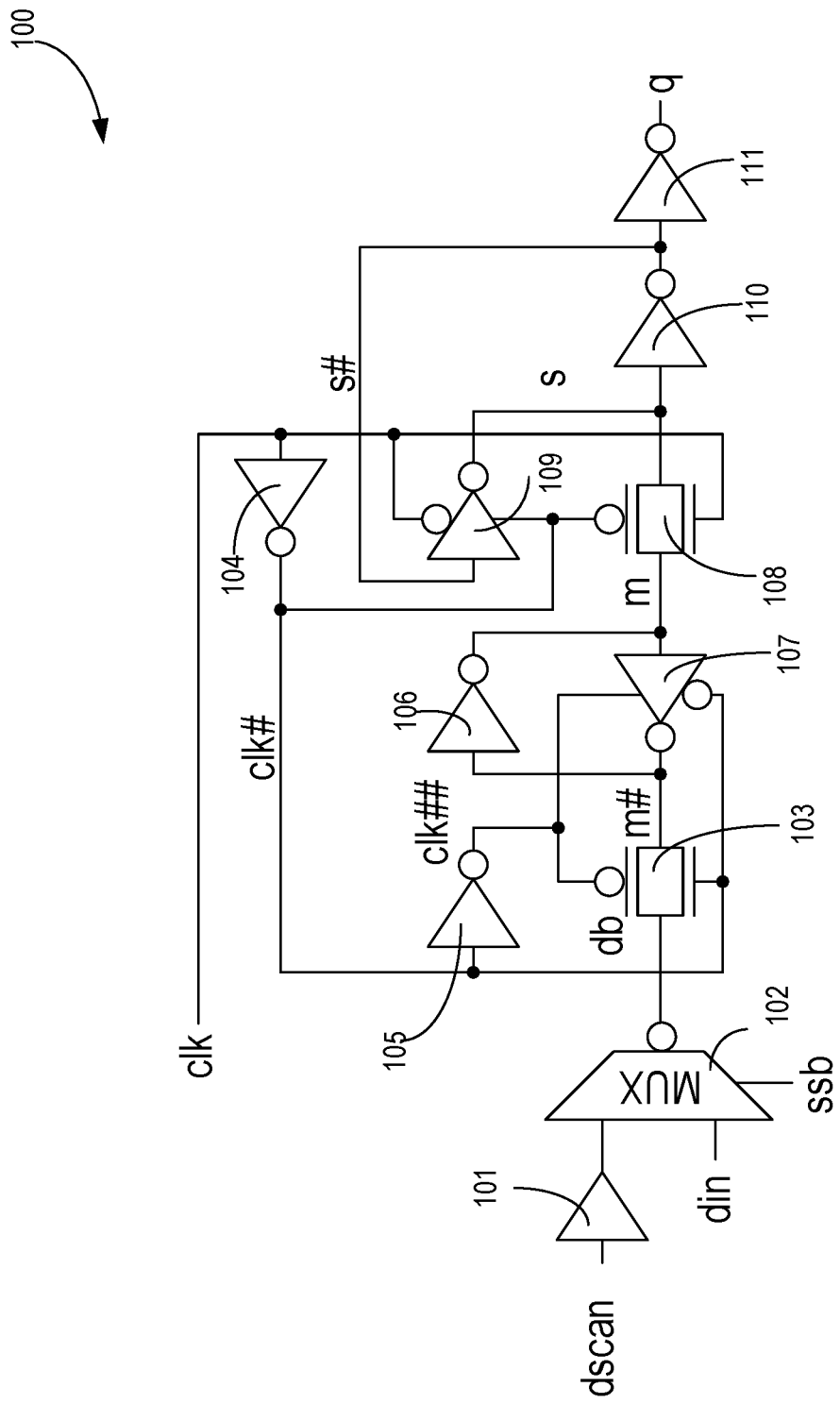
FIG. 1 illustrates a transmission gate based master-slave flip-flop (FF).

In clocked synchronous systems, a large percentage of the overall power dissipation is in the clock tree grid and final sequential load. Designing sequential units for low power consumption improve power efficiency of these clocked synchronous systems. Another knob to reduce power and improve power efficiency in such a system is to lower the supply voltage and scale down frequency. Voltage scaling of a chip may be constrained by the lowest operating voltage ($V_{MIN}$) under process variation. Here, $V_{MIN}$ generally refers to the lowest operating supply voltage below which the sequential or memory may lose its stored data. $V_{MIN}$ may also refer to the lowest operating supply voltage below which the sequential or memory may not reflect correct data because of retention, setup, or hold failures. One of the limiters of $V_{MIN}$ is the sequential hold time degradation at lower voltages resulting in frequency independent functional failures. Since the majority of sequential units have a very low data activity (e.g., 5-10%), clock power dominates the overall sequential dynamic power.

A large percentage of logic paths in a system may have timing slack or are non-critical. Since delay may not be the primary concern, these non-critical paths typically use sequential units with minimum sized transistors to reduce power. These minimum sized sequential units are a common power lever used in many microprocessor and SoC products. These sequential units cannot be downsized any further to take advantage of the timing slack because the sizing of the sequential units depends on the minimum sized transistors allowed by the process technology and that a minimum transistor width is needed to meet the product's $V_{MIN}$ requirements.

One way to reduce power consumption in sequential units is to use pulsed latches. However, pulsed latches degrade hold time and may also suffer pulse width evaporation issues. Another way to reduce power consumption in sequential units is to use auto-gated flip-flops (FFs) based on data probability. However, for minimum sized FFs, power benefit may not be realized for auto-gated FFs since the additional gating circuitry consumes more power than saved.

Various embodiments describe a family of fully-interruptible latch and master-slave FF circuits that take advantage of timing slack in non-critical paths to reduce the number of clocked transistors, resulting in lower power consumption for today's digital systems. Here, non-critical timing paths generally refer to data paths that have setup and/or hold margins when the processor having such paths is operating at its fastest frequency. Such paths are not the bottleneck for the processor to achieve its highest frequency. A fully interruptible design without contention in the circuit and static CMOS (Complementary Metal Oxide Semiconductor) implementation enables robust low voltage operation.

There are many technical effects of the various embodiments. For example, the number of clock transistors in a FF are reduced while maintaining a fully interruptible design that can operate at low supply voltages (e.g., 0.9V). As discussed here, conventional sequential units cannot be downsized any further to take advantage of the timing slack, since the sizing of the sequential units depends on the minimum sized transistors allowed by the process technology node's physical limits or $V_{MIN}$ requirement. Various embodiments disclose FF designs that take advantage of both setup and clk-to-q (i.e., a delay when a clock edge triggers to an output being generated) timing margin in data paths and translates it into lower power consumption. The FFs of various embodiments can be configured as vectored FFs. Vectoring the FFs amortizes the local clock inverter overhead saving clock power further, in accordance with some embodiments. The FFs of various embodiments use shared keeper and/or footer for one or both the master and slave stages to provide power reduction. For example, 27% to 59% power reduction for 10% data activity factor versus protected transmission-gate (TG) FF is achieved.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates a TG based master-slave FF 100. FF 100 consists of buffer 101, multiplexer 102, first TG 103, inverters 104, 105, 106, 110, and 111, tristate-able inverters 107 and 109, second TG 108, clock node "clk", scan data node "dscan", input data node "din", output 'q', multiplexer control node "ssb", internal nodes "clk##", 's', "s#", "db", "m#", and 'm' coupled together as shown. FF 100 is a single-ended TG flip-flop. To allow for low voltage scalability, the keeper circuits are fully-interruptible and require clock inversions for FFs. This increases the number of clock transistors, the clock load, and power. For example, FF 100 requires 12 clock transistors.

Figure 2:
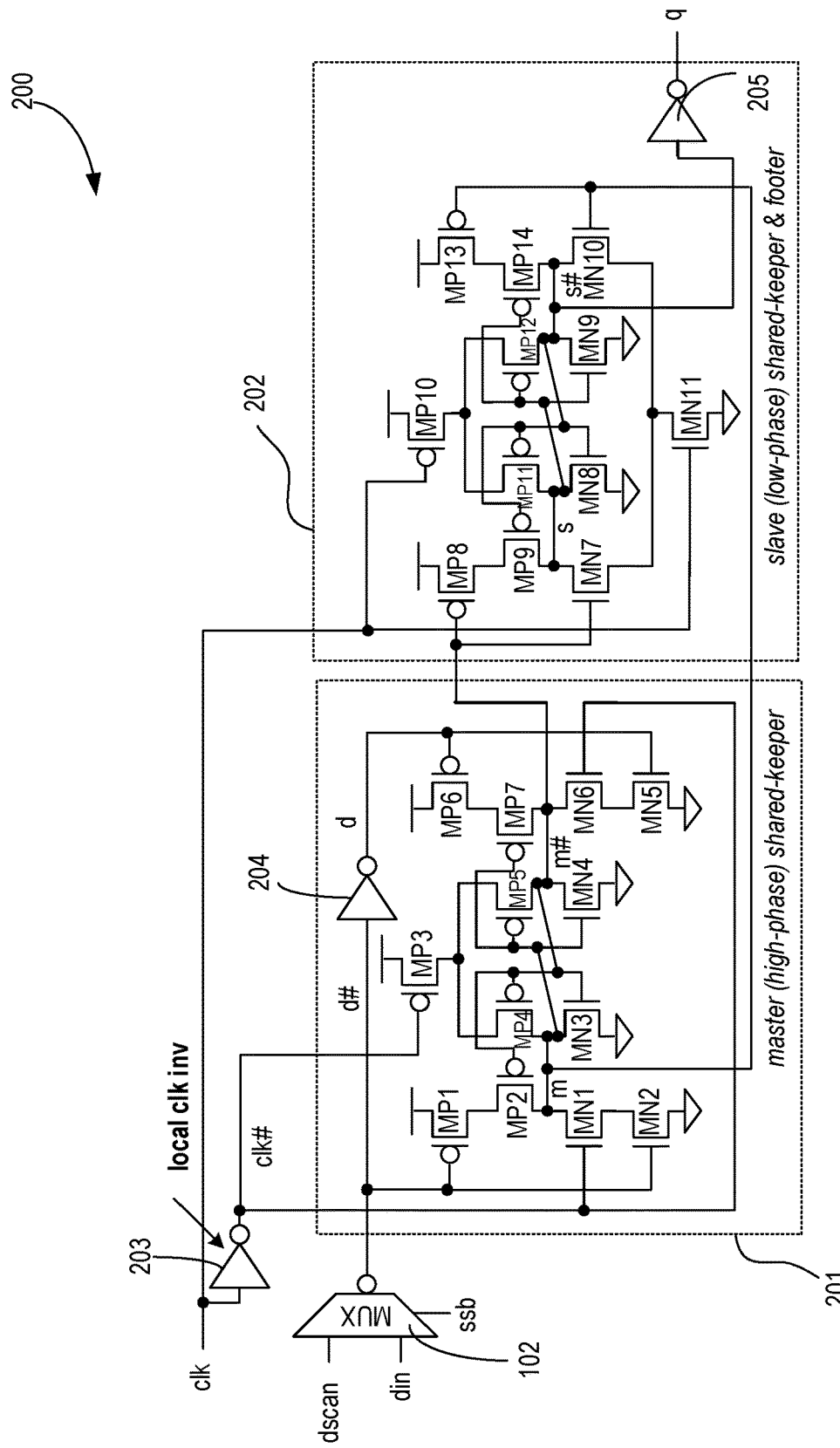
FIG. 2 illustrates a master-slave FF having seven clock transistors and with a shared keeper in a master latch and a shared keeper and shared footer in a slave latch, according to some embodiments.

FIG. 2 illustrates master-slave FF 200 having seven clock transistors and with a shared keeper in a master latch and a shared keeper and shared footer in a slave latch, according to some embodiments. It is pointed out that those elements of FIG. 2 having the same reference numbers (or names) as the elements of any other figure can operate or function in any manner similar to that described, but are not limited to such. In some embodiments, master-slave FF 200 includes a clock node "clk", scan data input node "dscan", input data node "din", multiplexer control node "ssb", output node 'q', master latch 201, slave latch 202, multiplexer 102, and local clock inverter 203.

In some embodiments, master latch 201 includes first p-type transistor MP1, second p-type transistor MP2, third p-type transistor MP3 also referred to as shared p-type keeper MP3, fourth p-type transistor MP4, fifth p-type transistor MP5, sixth p-type transistor MP6, seventh p-type transistor MP7, first n-type transistor MN1, second n-type transistor MN2, third n-type transistor MN3, fourth n-type transistor MN4, fifth n-type transistor MN5, and sixth n-type transistor MN6, inverter 204, and internal nodes "d#", 'd', 'm', "m#", and "clk#", coupled together as shown. Here, master latch 201 is also referred to as master (high-phase) shared-keeper based latch because the latch is transparent in high phase of the clock.

In some embodiments, slave latch 202 includes eighth p-type transistor MP8, ninth p-type transistor MP9, tenth p-type transistor MP10 also referred to as shared p-type keeper MP10, eleventh p-type transistor MP11, twelfth p-type transistor MP12, thirteen p-type transistor MP13, fourteen p-type transistor MP14, seventh n-type transistor MN7, eighth n-type transistor MN8, ninth n-type transistor MN9, tenth n-type transistor MN10, eleventh n-type transistor MN11 also referred to as shared n-type footer MN11, inverter 205, and internal nodes "s#", 's', 'q', "clk", "m#", and 'm', coupled together as shown. Here, slave latch 202 is also referred to as slave (N-first) shared-keeper and footer based latch because the latch is transparent in high phase of the clock.

The master-slave FF 200 of some embodiments uses a seven clock transistors based FF design. These transistors are coupled to node "clk" and "clk#". In some embodiments, master-slave FF 200 is implemented using 3-clock transistors in the master latch 201: master (N-first) shared keeper MP3, first n-type transistor MN1, and sixth n-type transistor MN6. In some embodiments, master-slave FF 200 is implemented using 2-clock transistors in the slave latch 202: slave (N-first) shared keeper MP10 and shared footer MN11. Including the two transistors of local clock inverter 203, and adding them with the three clock transistors of master latch 201 and the two clock transistors of slave latch 202, the total clock transistors in master-slave FF 200 are seven clock transistors. In comparison, the TG based FF 100 has twelve clock transistors. By reducing the clock transistors from twelve to seven, transistors switching at clock frequency are reduced which in turn reduces power consumption.

In some embodiments, shared keeper MP3 provides power supply to cross-coupled inverters comprising transistors MP4, MP5, MN3, and MN4. In some embodiments, shared keeper MP10 provides power supply to cross-coupled inverters comprising transistors MP11, MP12, MN8, and MN9. In some embodiments, shared footer MN11 is formed by eliminating separate n-type transistors coupled in series transistors MN7 and MN10, respectively.

In some embodiments, the local clock inverter 203 between master and slave latches (201 and 202) changes master latch 201 to be an N-first latch, which eliminates high to low switching input condition for slave latch 202 and hence eliminating charge sharing in shared-keeper/footer latch. The charge sharing issue is illustrated by FIG. 3.

Figure 3:
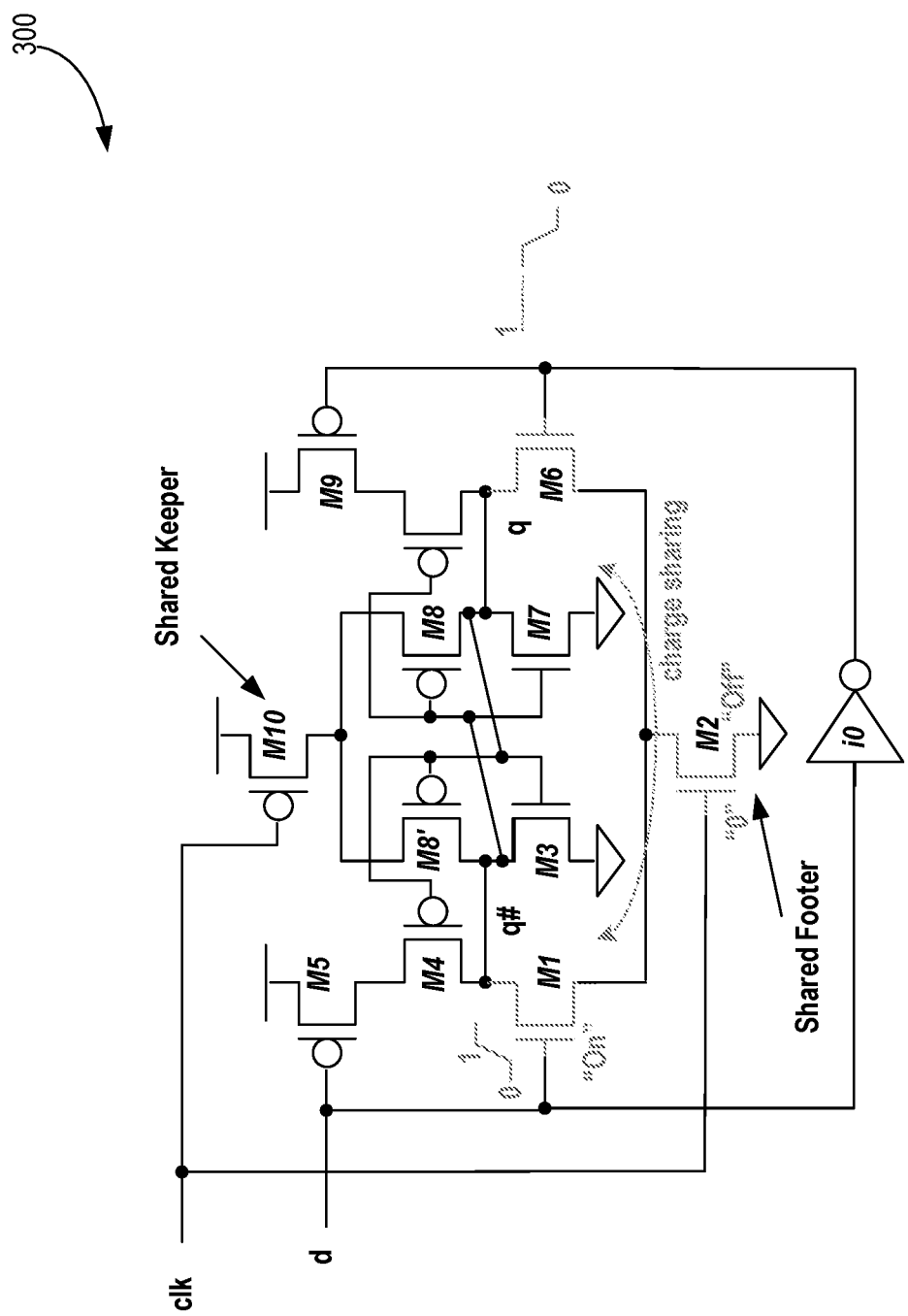
FIG. 3 illustrates a master or slave latch with a shared footer resulting in charge sharing.

FIG. 3 illustrates circuit 300 of a master or slave latch with a shared footer resulting in charge sharing. Circuit 300 consists of n-type transistors M1, M2, M3, M6, and M7; p-type transistors M4, M5, M8', M8, M9, and M10; clock node "clk", data node 'd', internal nodes "q#" and 'q'; and inverter i0 coupled together as shown.

Circuit 300 (also referred to as shared-footer latch) has a charge sharing issue when it is holding the data on nodes "q#" and 'q' (e.g., when clock "clk" is turned off) and when data input 'd' switches from low-to-high. Here, reference to node names and signal names are interchangeably used. For example, "clk" may refer to clock node "clk" or clock signal "clk" on that node, depending on the context of the sentence.

Continuing with the above example, when data is being held on nodes "q#" and 'q', both data transistors M1 and M6 are turned on for a delay of inverter i0, resulting in charge sharing that may cause data flipping. In some embodiments, this charge sharing issue is resolved by local clock inverter 203 which is inserted between master latch 201 and slave latch 202. This inverter 203 changes master latch to be an N-first latch, which eliminates high to low switching input condition for slave latch 202 and hence eliminating charge sharing in shared keeper/footer latch, in accordance with some embodiments.

Figure 4:
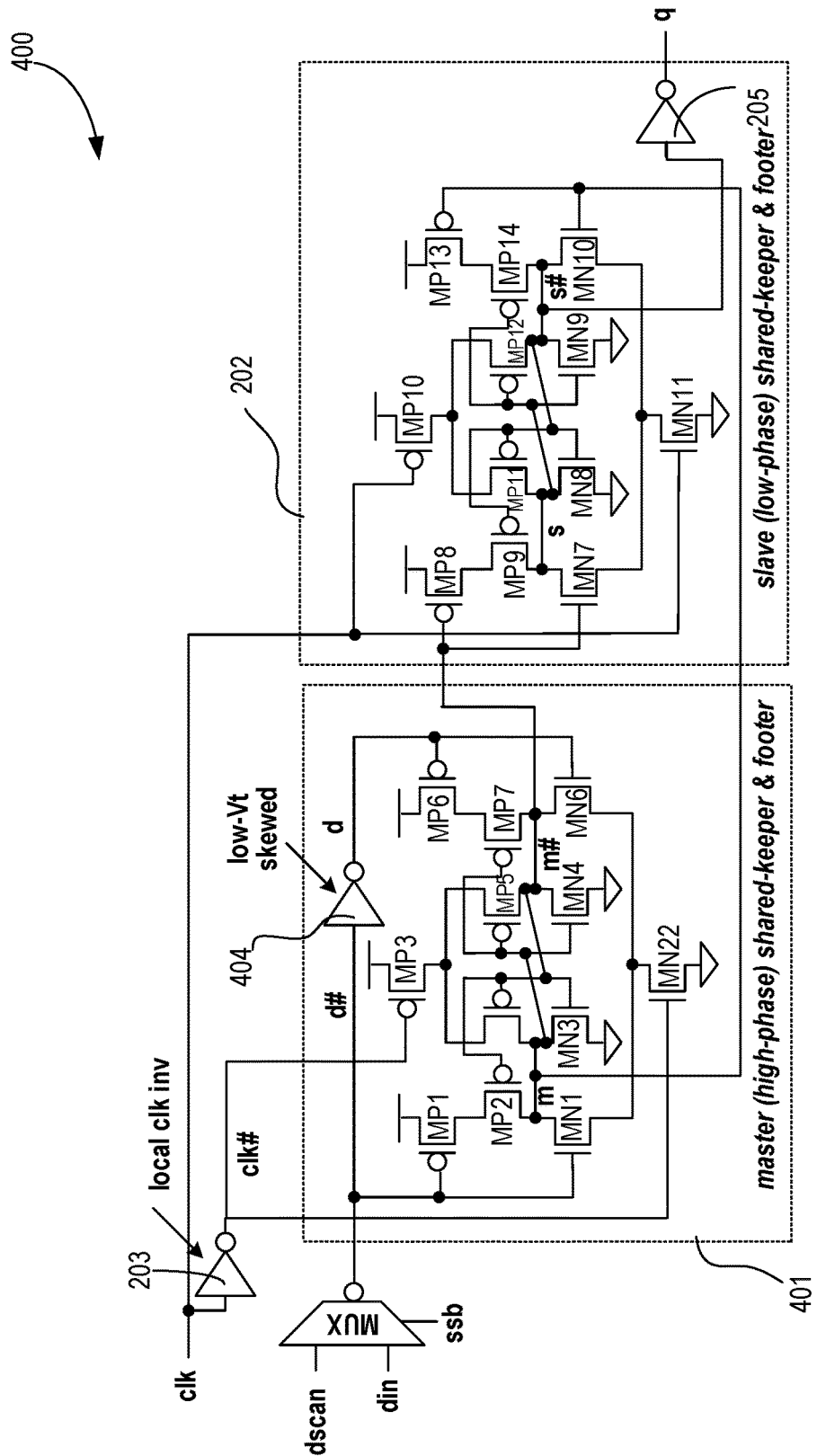
FIG. 4 illustrates a master-slave FF having six clock transistors and with a shared keeper and shared footer in a master latch and a shared keeper and shared footer in a slave latch, according to some embodiments.

FIG. 4 illustrates master-slave FF 400 having six clock transistors and with a shared keeper and shared footer in a master latch and a shared keeper and shared footer in a slave latch, according to some embodiments. It is pointed out that those elements of FIG. 4 having the same reference numbers (or names) as the elements of any other figure can operate or function in any manner similar to that described, but are not limited to such. So as not to obscure the embodiments, differences between FIG. 2 and FIG. 4 are described.

Compared to master-slave FF 200, here inverter 204 is replaced with inverter 404 having at least one transistor which has low threshold (Vt). In some embodiments, all transistors of inverter 404 are low Vt transistors. In some embodiments, the transistors of inverter 404 are skewed to reduce the delay during master latch 401 charge sharing condition and hence reducing data flipping probability discussed with reference to FIG. 3. Referring back to FIG. 4, in some embodiments, transistors of inverter 404 are low Vt transistors as well as skewed to reduce the delay during master latch 401 charge sharing condition. In some embodiments, except for transistors of inverter 404, all other transistors of master flip-flop 400 are high or normal Vt transistors.

In some embodiments, master latch 401 includes n-type shared footer MN22. For example, transistors MN2 and MN5 are removed and replaced with a single transistor MN22. As such, master-slave flip-flop 400 has a two-clock transistors N-first shared-keeper/footer latch for both master latch 401 and slave latch 202 along with a local clock inverter (e.g., 2-clock transistors). This enables master latch 401 to be implemented using two clock transistors shared-keeper/footer latch resulting in a total of six clock transistors for master-slave FF 400.

Figure 5:
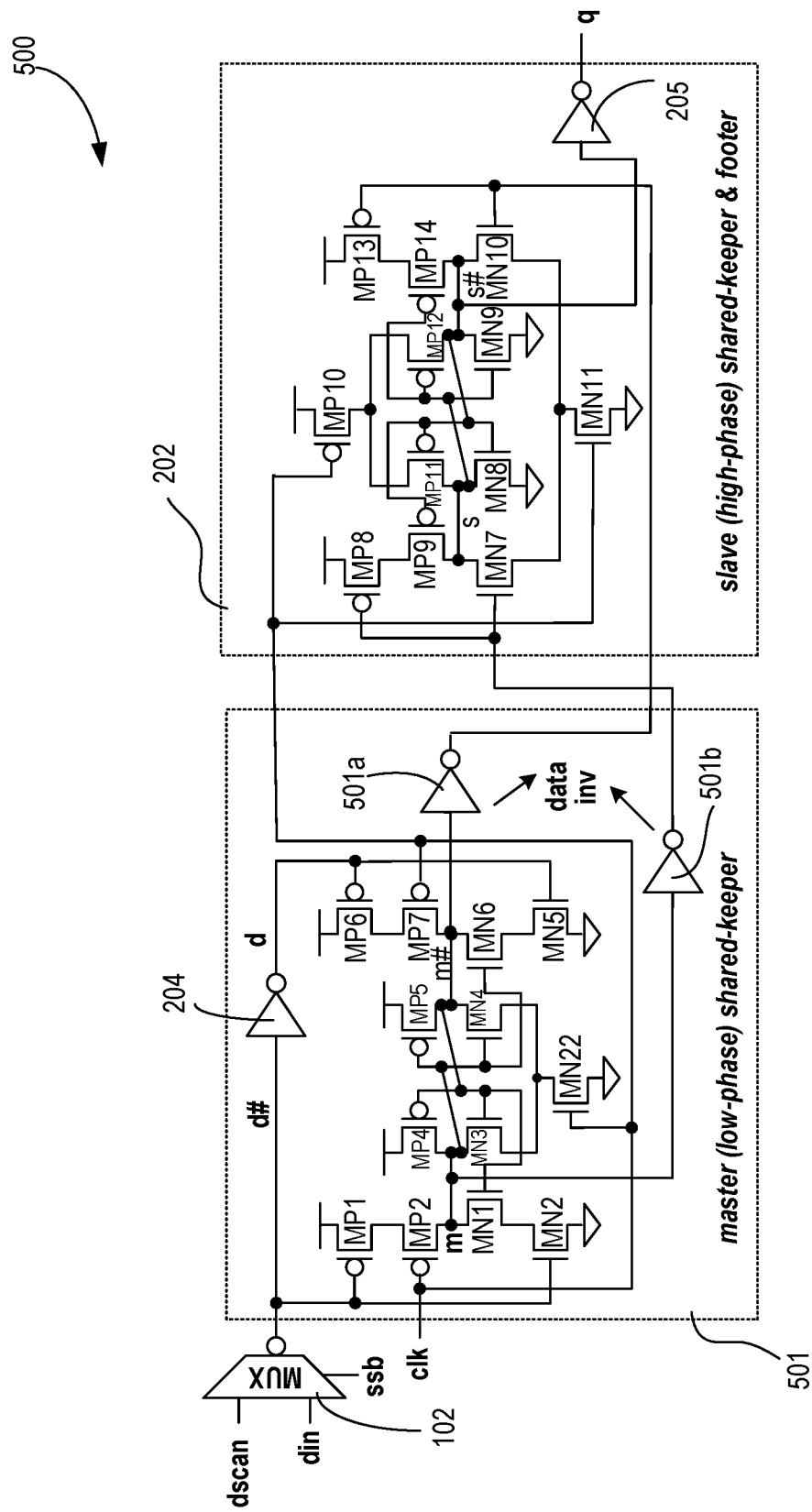
FIG. 5 illustrates a master-slave FF having five clock transistors and with a shared keeper in a master latch and a shared keeper and shared footer in a slave latch, according to some embodiments.

FIG. 5 illustrates master-slave FF 500 having five clock transistors and with a shared keeper in a master latch and a shared keeper and shared footer in a slave latch, according to some embodiments. It is pointed out that those elements of FIG. 5 having the same reference numbers (or names) as the elements of any other figure can operate or function in any manner similar to that described, but are not limited to such. So as not to obscure the embodiments, differences between FIG. 2 and FIG. 5 are described.

Compared to master-slave latch 200 of FIG. 2, here inverter 203 is removed and clock "clk" is directly provided to the transistors of master latch 501 and slave latch 202. Another difference is that master latch 201 is replaced with master latch 501. In some embodiments, master latch 501 includes first p-type transistor MP1, second p-type transistor MP2, fourth p-type transistor MP4, fifth p-type transistor MP5, sixth p-type transistor MP6, seventh p-type transistor MP7, first n-type transistor MN1, second n-type transistor MN2, third n-type transistor MN3, fourth n-type transistor MN4, fifth n-type transistor MN5, and sixth n-type transistor MN6, inverter 204, inverter 501a, inverter 501b, n-type shared keeper transistors MN22, and internal nodes "d#", 'd', 'm', and "m#" coupled together as shown. Here, master latch 501 is also referred to as master (low phase) shared-keeper based latch because the latch is transparent in low phase of the clock.

Master-slave FF 500 has a total of five clock transistors, in accordance with some embodiments. For example, master latch 501 includes three clock transistors in transistor MP2, shared n-type keeper MN22, and transistor MP7 while slave latch 202 includes two clock transistors in shared p-type keeper MP10 and shared n-type footer MN11. In some embodiments, to prevent charge sharing in the slave shared-footer MN11, two additional data inverters 501a and 501b are added between master latch 501 and slave latch 202, or in master latch 501 as shown. These inverters eliminate high to low switching input condition for slave latch 202, according to some embodiments. As such, charge sharing is eliminated in slave latch 202 (also referred to as shared-keeper/footer latch 202). The added data inverters 501a and 501b may trade-off clock power savings with increase in setup time delay and data power, and so master-slave flip-flop 500 can be added to non-timing critical data paths, in accordance with some embodiments.

Figure 6:
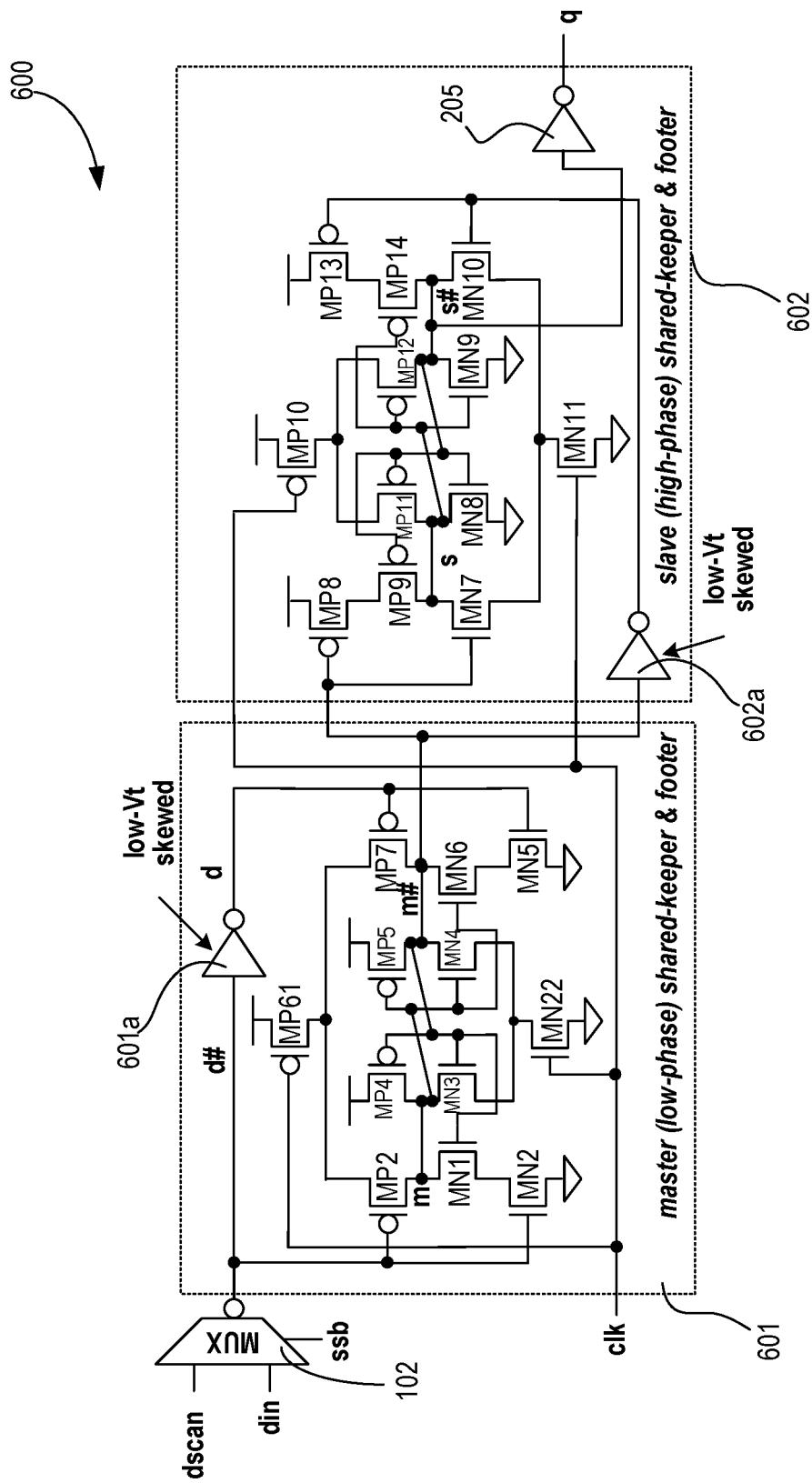
FIG. 6 illustrates a master-slave FF having four clock transistors and with a shared keeper and shared footer in a master latch and a shared keeper and shared footer in a slave latch, according to some embodiments.

FIG. 6 illustrates master-slave FF 600 having four clock transistors and with a shared keeper and shared footer in a master latch and a shared keeper and shared footer in a slave latch, according to some embodiments. It is pointed out that those elements of FIG. 6 having the same reference numbers (or names) as the elements of any other figure can operate or function in any manner similar to that described, but are not limited to such. So as not to obscure the embodiments, difference between FIG. 5 and FIG. 6 are described.

Compared to master-slave FF of FIG. 5, here the master latch 601 uses a shared-keeper and footer architecture with low Vt and/or skewed inverter 601a (instead of non-skewed and regular/normal Vt inverter 204), and data inverter 501a and 501b are removed. In some embodiments, p-type transistor MP61 forms the shared footer. As such, p-type transistors MP1 and MP6 are removed and replaced with shared footer MP61.

In some embodiments, master-slave FF 600 includes a clock node "clk", scan data input node "dscan", input data node "din", multiplexer control node "ssb", output node 'q', master latch 601, slave latch 602, and multiplexer 102.

In some embodiments, slave latch 202 is replaced with slave latch 602. Slave latch 602 is similar to slave latch 202 and includes data inverter 602a which comprises at least one (or all) transistors as low threshold transistors which are skewed. The gate terminals of transistors MP8 and MN7 are coupled to node "m#".

In some embodiments, the transistors of inverter 601a and 602a are skewed to reduce the delay during master latch 601 charge sharing condition and hence reducing data flipping probability discussed with reference to FIG. 3. Referring back to FIG. 6, in some embodiments, transistors of inverters 601a and 602a are low Vt transistors as well as skewed to reduce the delay during master latch 601 charge sharing condition. In some embodiments, except for transistors of inverters 601a and 602a, all other transistors of master flip-flop 600 are high or normal Vt transistors. In some embodiments, inverter 601a helps in reducing charge sharing in master latch 601. In some embodiments, inverter 602a helps in reducing charge sharing in slave latch 602.

Master-slave flip-flop 600 implements with a total of four clock transistors. For example, master latch 601 has 2-clock transistors in P-first shared footer MP61 and keeper MN22, and 2-clock transistors in shared-keeper/footer MP10 and MN11, respectively.

Figure 7:
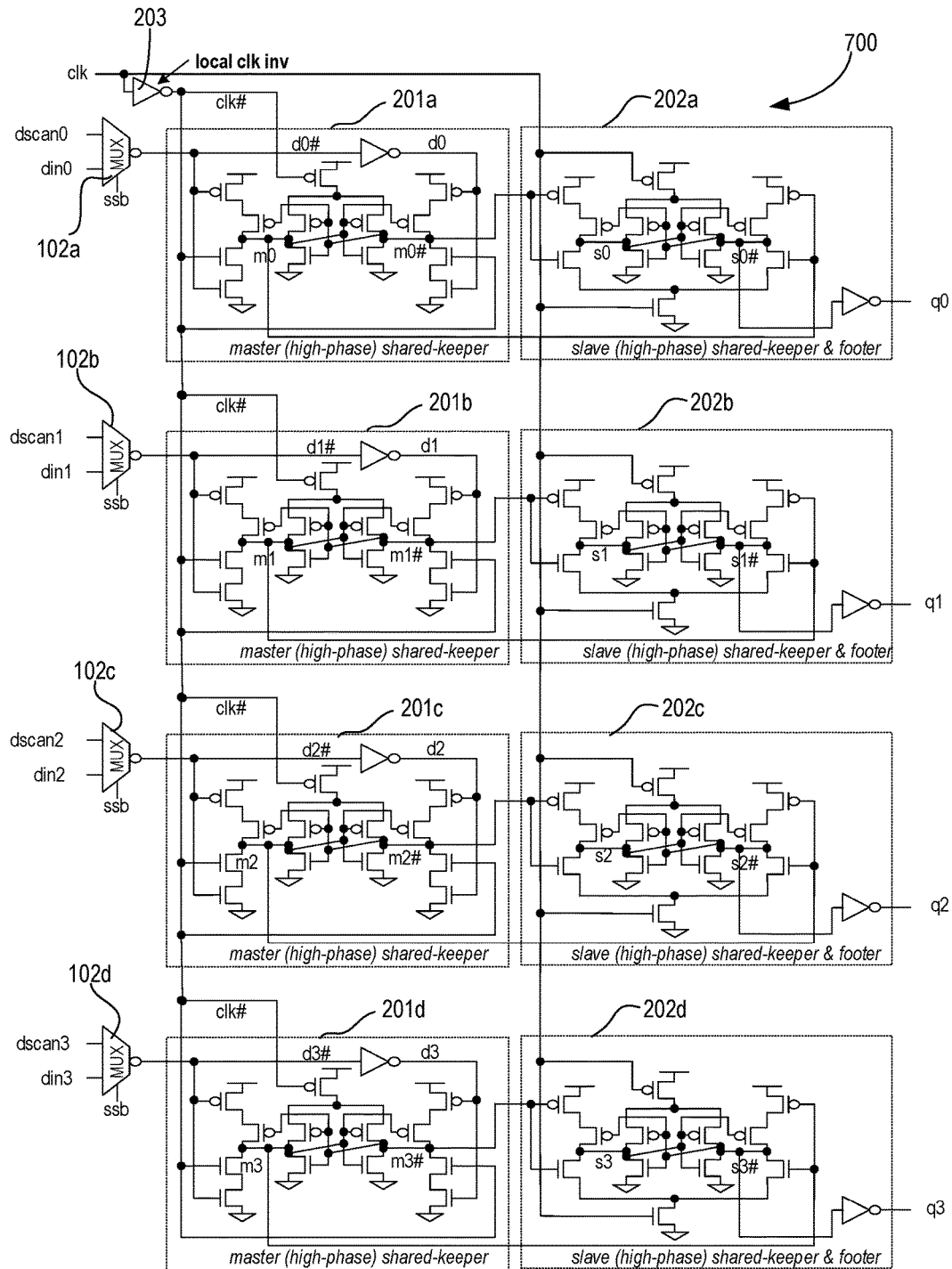
FIG. 7 illustrates a vectored FF comprising master-slave FFs of FIG. 2, according to some embodiments of the disclosure.

FIG. 7 illustrates a vectored FF 700 comprising master-slave FFs of FIG. 2, according to some embodiments of the disclosure. It is pointed out that those elements of FIG. 7 having the same reference numbers (or names) as the elements of any other figure can operate or function in any manner similar to that described, but are not limited to such.

While the embodiment of FIG. 7 illustrates four FFs coupled together to form a vectored FF 700, any number of FFs can be coupled together. In some embodiments, vectored FF 700 comprises a first master-slave FF having multiplexer 102a, master latch 201a (same as master latch 201 of FIG. 2) and slave latch 202a (same as slave latch 202 of FIG. 2). In some embodiments, master latch 201a has internal nodes "m0" (same as 'm'), "m0#" (same as "m#"), data node "d0#" (same as "d#"), node "d0" (same as 'd'). In some embodiments, slave latch 202a has internal nodes "s0" (same as 's') and "s0#" (same as "s#"). In some embodiments, multiplexer 102a receives scan data "dscan0" and input data "din0". The output of the first master-slave flip-flop is "q0".

In some embodiments, vectored FF 700 comprises a second master-slave FF having multiplexer 102b, master latch 201b (same as master latch 201 of FIG. 2) and slave latch 202b (same as slave latch 202 of FIG. 2). In some embodiments, master latch 201b has internal nodes "m1" (same as 'm'), "m1#" (same as "m#"), data node "d1#" (same as "d#"), node "d1" (same as 'd'). In some embodiments, slave latch 202b has internal nodes "s1" (same as 's') and "s1#" (same as "s#"). In some embodiments, multiplexer 102b receives scan data "dscan1" and input data "din1". The output of the second master-slave flip-flop is "q1".

In some embodiments, vectored flip-flop 700 comprises a third master-slave FF having multiplexer 102c, master latch 201c (same as master latch 201 of FIG. 2) and slave latch 202c (same as slave latch 202 of FIG. 2). In some embodiments, master latch 201c has internal nodes "m2" (same as 'm'), "m2#" (same as "m#"), data node "d2#" (same as "d#"), node "d2" (same as 'd'). In some embodiments, slave latch 202c has internal nodes "s2" (same as 's') and "s2#" (same as "s#"). In some embodiments, multiplexer 102c receives scan data "dscan2" and input data "din2". The output of the third master-slave FF is "q2".

In some embodiments, vectored FF 700 comprises fourth master-slave FF having multiplexer 102d, master latch 201d (same as master latch 201 of FIG. 2) and slave latch 202d (same as slave latch 202 of FIG. 2). In some embodiments, master latch 201d has internal nodes "m3" (same as 'm'), "m3#" (same as "m#"), data node "d3#" (same as "d#"), node "d3" (same as 'd'). In some embodiments, slave latch 202d has internal nodes "s3" (same as 's') and "s3#" (same as "s#"). In some embodiments, multiplexer 102d receives scan data "dscan3" and input data "din3". The output of the first master-slave flip-flop is "q3".

In some embodiments, multiplexers 102a/b/c/d receive the same control signal "ssb" to switch between data mode (which selects data inputs din0, din1, din2, and din3 as outputs of the multiplexer) and data scan mode (which selects data inputs dscan0, dscan1, dscan2, and dscan3 as outputs of the multiplexer). In some embodiments, multiplexers 102a/b/c/d receive the different control signals "ssb" to switch between data mode and data scan mode. In some embodiments, to reduce clock power, lock clock inverter 203 is shared by all master-slave latches.

Figure 8:
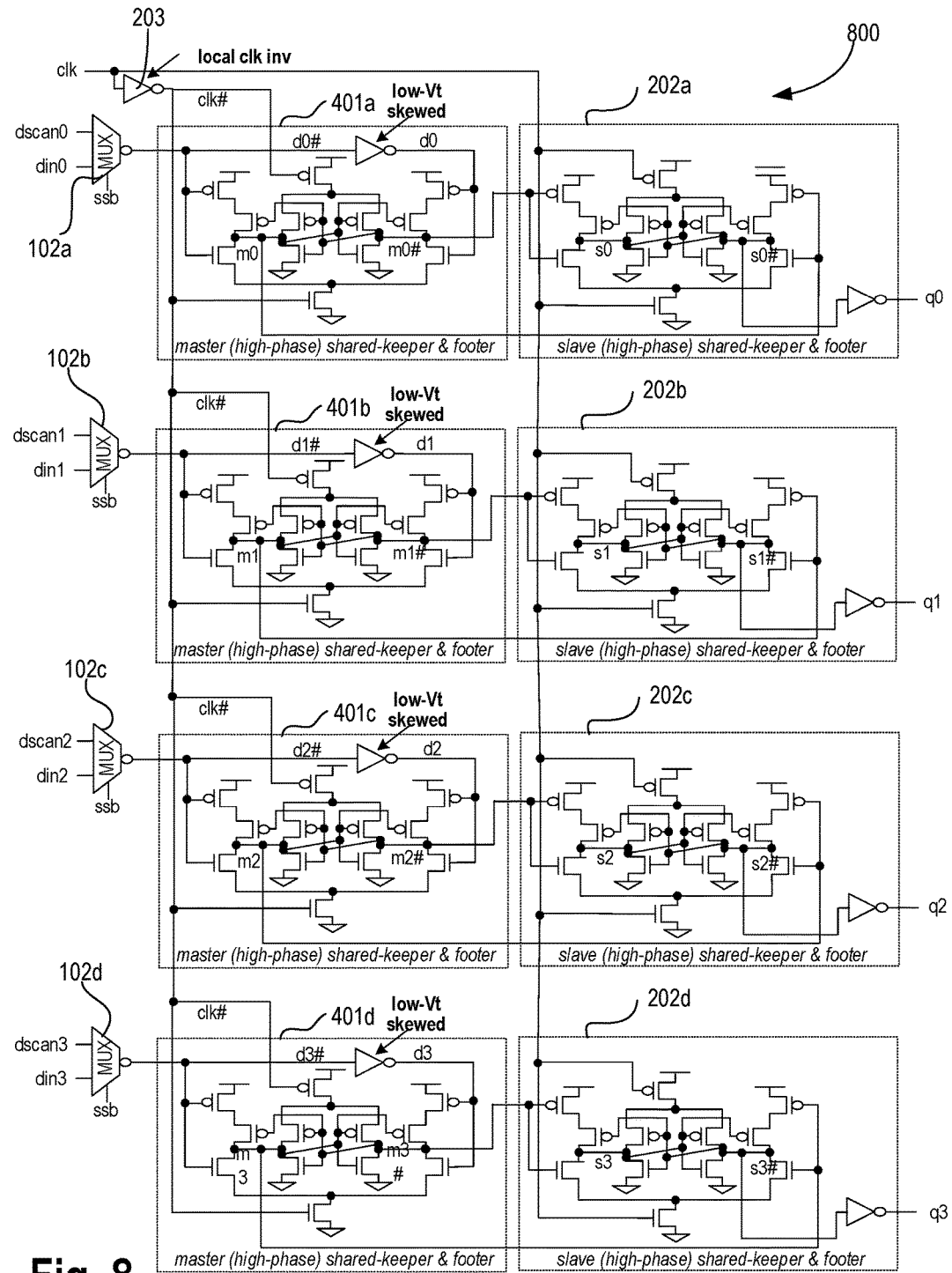
FIG. 8 illustrates a vectored FF comprising master-slave FFs of FIG. 4, according to some embodiments of the disclosure.

FIG. 8 illustrates vectored FF 800 comprising master-slave FFs of FIG. 4, according to some embodiments of the disclosure. It is pointed out that those elements of FIG. 8 having the same reference numbers (or names) as the elements of any other figure can operate or function in any manner similar to that described, but are not limited to such.

While the embodiment of FIG. 8 illustrates four FFs coupled together to form a vectored FF 800, any number of FFs can be coupled together. In some embodiments, vectored FF 800 comprises a first master-slave FF having multiplexer 102a, master latch 401a (same as master latch 401 of FIG. 4) and slave latch 202a (same as slave latch 202 of FIG. 2). In some embodiments, master latch 401a has internal nodes "m0" (same as 'm'), "m0#" (same as "m#"), data node "d0#" (same as "d#"), node "d0" (same as 'd'). In some embodiments, slave latch 202a has internal nodes "s0" (same as 's') and "s0#" (same as "s#"). In some embodiments, multiplexer 102a receives scan data "dscan0" and input data "din0". The output of the first master-slave FF is "q0".

In some embodiments, vectored FF 800 comprises a second master-slave FF having multiplexer 102b, master latch 401b (same as master latch 401 of FIG. 4) and slave latch 202b (same as slave latch 202 of FIG. 2). In some embodiments, master latch 401b has internal nodes "m1" (same as 'm'), "m1#" (same as "m#"), data node "d1#" (same as "d#"), node "d1" (same as 'd'). In some embodiments, slave latch 202b has internal nodes "s1" (same as 's') and "s1#" (same as "s#"). In some embodiments, multiplexer 102b receives scan data "dscan1" and input data "din1". The output of the second master-slave flip-flop is "q1".

In some embodiments, vectored FF 800 comprises a third master-slave FF having multiplexer 102c, master latch 401c (same as master latch 401 of FIG. 4) and slave latch 202c (same as slave latch 202 of FIG. 2). In some embodiments, master latch 201c has internal nodes "m2" (same as 'm'), "m2#" (same as "m#"), data node "d2#" (same as "d#"), node "d2" (same as 'd'). In some embodiments, slave latch 202c has internal nodes "s2" (same as 's') and "s2#" (same as "s#"). In some embodiments, multiplexer 102c receives scan data "dscan2" and input data "din2". The output of the third master-slave flip-flop is "q2".

In some embodiments, vectored FF 800 comprises fourth master-slave flip-flop having multiplexer 102d, master latch 401d (same as master latch 401 of FIG. 4) and slave latch 202d (same as slave latch 202 of FIG. 2). In some embodiments, master latch 201d has internal nodes "m3" (same as 'm'), "m3#" (same as "m#"), data node "d3#" (same as "d#"), node "d3" (same as 'd'). In some embodiments, slave latch 202d has internal nodes "s3" (same as 's') and "s3#" (same as "s#"). In some embodiments, multiplexer 102d receives scan data "dscan3" and input data "din3". The output of the first master-slave flip-flop is "q3".

In some embodiments, multiplexers 102a/b/c/d receive the same control signal "ssb" to switch between data mode (which selects data inputs din0, din1, din2, and din3 as outputs of the multiplexer) and data scan mode (which selects data inputs dscan0, dscan1, dscan2, and dscan3 as outputs of the multiplexer). In some embodiments, multiplexers 102a/b/c/d receive the different control signals "ssb" to switch between data mode and data scan mode. In some embodiments, to reduce clock power, lock clock inverter 203 is shared by all master-slave latches.

Figure 9:
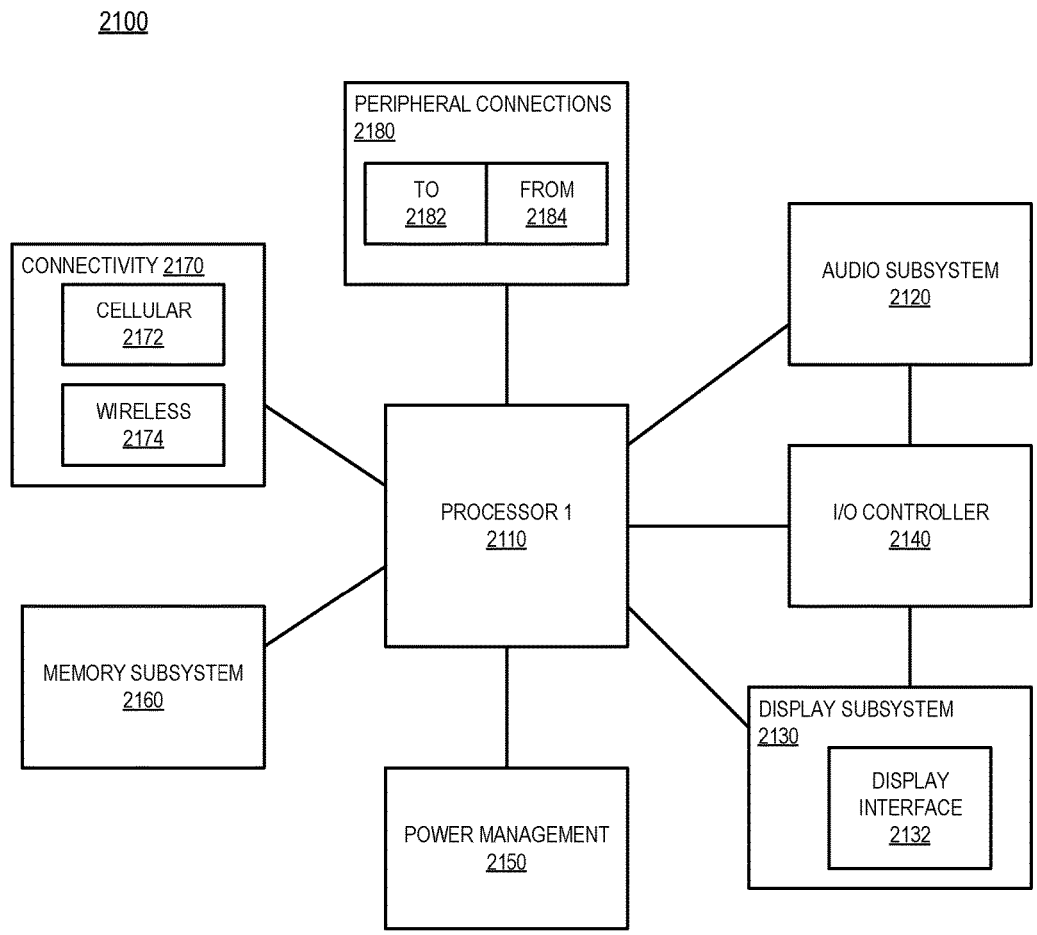
FIG. 9 illustrates a smart device or a computer system or a SoC (System-on-Chip) with FFs having reduced clock load, in accordance with some embodiments.

FIG. 9 illustrates a smart device or a computer system or a SoC (System-on-Chip) with flip-flops having reduced clock load, in accordance with some embodiments. It is pointed out that those elements of FIG. 9 having the same reference numbers (or names) as the elements of any other figure can operate or function in any manner similar to that described, but are not limited to such.

FIG. 9 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 with flip-flops having reduced clock load (e.g., master-slave flip-flops of FIG. 2 and FIGS. 4-8), according to some embodiments discussed. Other blocks of the computing device 2100 may also include flip-flops having reduced clock load (e.g., master-slave flip-flops of FIG. 2 and FIGS. 4-8) according to some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a clock node; a first inverter having an input coupled to the clock node; a data node; a master latch with a shared p-type keeper coupled to an output of the first inverter, the master latch coupled to the data node; and a slave latch coupled to an output of the master latch, the slave latch having a shared p-type keeper and a shared n-type footer, wherein the shared p-type keeper and the shared n-type footer of the slave latch are coupled to the clock node and the input of the first inverter. In some embodiments, the apparatus comprises a second inverter coupled to the data node, wherein the second inverter is to have a skewed input to output delay. In some embodiments, the second inverter comprises at least one transistor which has a low threshold voltage, and wherein transistors of the first inverter are high threshold voltage transistors. In some embodiments, an input of the second inverter is coupled to the data node, and wherein the output of the second inverter is coupled to the master latch.

In some embodiments, the shared p-type keeper of the master latch is to provide a power supply to a memory element of the master latch. In some embodiments, the shared p-type keeper of the slave latch is to provide a power supply to a memory element of the slave latch. In some embodiments, the apparatus comprises a multiplexer coupled to the data node. In some embodiments, the multiplexer is to selectively couple a scan data input or a regular data input to the data node. In some embodiments, the apparatus has at most seven clock transistors.

In another example, an apparatus is provided which comprises: a clock node; a data node; a first inverter having an input coupled to the data node; a master latch with a shared n-type footer coupled to the data node and the input of the first inverter; and a slave latch having a shared p-type keeper and a shared n-type footer, wherein the shared p-type keeper and the shared n-type footer of the slave latch are coupled to the clock node, wherein the master latch comprises two inverters having outputs coupled to the slave latch. In some embodiments, the apparatus has at most five clock transistors. In some embodiments, the apparatus comprises a multiplexer coupled to the data node and the input of the first inverter. In some embodiments, the master latch includes a shared p-type keeper coupled to the clock node.

In another example, a system is provided which comprises: a memory; a processor coupled to the memory, the processor including a vectored flip-flop having at least two flip-flops, wherein the vectored flip-flop includes: a clock node; and a first inverter having an input coupled to the clock node, wherein the clock node and the first inverter are shared by the at least two flip-flops; wherein each of the at least two flip-flops includes: a data node; a master latch with a shared p-type keeper coupled to an output of the first inverter, the master latch coupled to the data node; and a slave latch coupled to an output of the master latch, the slave latch having a shared p-type keeper and a shared n-type footer, wherein the shared p-type keeper and the shared n-type footer of the slave latch are coupled to the clock node and the input of the first inverter; and a wireless interface for allowing the processor to communicate with another device.

In some embodiments, the at least two flip-flops comprise a second inverter coupled to the data node, and wherein the second inverter has a skewed input to output delay. In some embodiments, the second inverter comprises at least one transistor which has a low threshold voltage, and wherein transistors of the first inverter are high threshold voltage transistors. In some embodiments, the shared p-type keeper of the master latch is to provide a power supply to a memory element of the master latch. In some embodiments, the shared p-type keeper of the slave latch is to provide a power supply to a memory element of the slave latch. In some embodiments, the at least two flip-flops comprise a multiplexer coupled to the data node. In some embodiments, the vectored flip-flop has at most seven clock transistors associated per flip-flop.

In another example, a method is provided which comprises: inverting a clock received on a clock node; providing the inverted clock to a shared p-type keeper of a master latch, wherein the master latch is coupled to a data node; providing output of the master latch to a slave latch; and providing one of the clock or the inverted clock to a shared p-type keeper and a shared n-type footer of the slave latch. In some embodiments, the method comprises: inverting data received on the data node. In some embodiments, the method comprises skewing input to output delay associated with data on the data node. In some embodiments, the method comprises providing a power supply to a memory element of the master latch using the shared p-type keeper of the master latch. In some embodiments, the method comprises providing a power supply to a memory element of the slave latch via the shared p-type keeper. In some embodiments, the method comprises selectively coupling a scan data input or a regular data input to the data node.

In another example, an apparatus is provided which comprises: means for inverting a clock received on a clock node; means for providing the inverted clock to a shared p-type keeper of a master latch, wherein the master latch is coupled to a data node; means for providing output of the master latch to a slave latch; and means for providing one of the clock or the inverted clock to a shared p-type keeper and a shared n-type footer of the slave latch. In some embodiments, the apparatus comprises means for inverting data received on the data node. In some embodiments, comprises means for skewing input to output delay associated with data on the data node. In some embodiments, the apparatus comprises means for providing a power supply to a memory element of the master latch using the shared p-type keeper of the master latch. In some embodiments, the apparatus comprises means for providing a power supply to a memory element of the slave latch via the shared p-type keeper. In some embodiments, the apparatus comprises means for selectively coupling a scan data input or a regular data input to the data node.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a master latch comprising a keeper controllable by a clock input, wherein the keeper of the master latch is coupled to a memory circuitry of the master latch; and
   a slave latch coupled to an output of the master latch, wherein the slave latch comprises a footer controllable by an inverse of the clock input, and wherein the footer of the slave latch is coupled to a memory circuitry of the slave latch.

2. The apparatus of claim 1, wherein the slave latch comprises a keeper controllable by the inverse of the clock input, and wherein the keeper of the slave latch is coupled to a memory circuitry of the slave latch.

3. The apparatus of claim 1, wherein the master latch comprises a footer controllable by the clock input, wherein the footer is coupled to the memory circuitry via a device.

4. The apparatus of claim 1, wherein the master latch comprises an inverter coupled to a data input, wherein the inverter is to provide a skewed input-to-output delay.

5. The apparatus of claim 1, wherein the keeper of the master latch is to provide a controllable power supply to the memory circuitry of the master latch.

6. The apparatus of claim 2, wherein the keeper of the slave latch is to provide a controllable power supply to the memory circuitry of the slave latch.

7. The apparatus of claim 2, wherein the master latch and the slave latch have an associated clock path which has at most seven transistors in the master and slaves latches.

8. The apparatus of claim 2, wherein the master latch is a high-clock-phase latch, while the slave latch is a low-clock-phase latch.

9. An apparatus comprising:
a vectored flip-flop comprising a first flip-flop and a second flip-flop, wherein one of the first or second flip-flops comprises a master latch comprising a keeper controllable by a clock input, wherein the keeper of the master latch is coupled to a memory circuitry of the master latch;
an inverter to provide an inverse of the clock input, wherein the inverter is shared by the first and second flip-flops; and
a selection circuitry coupled to a first data input and a first scan input, wherein an output of the selection circuity is coupled to the first flip-flop.

10. The apparatus of claim 9, wherein one of the first or second flip-flops comprises a slave latch coupled to an output of the master latch, wherein the slave latch comprises a keeper controllable by the clock input, and wherein the keeper of the slave latch is coupled to a memory circuitry of the slave latch.

11. The apparatus of claim 9, wherein the selection circuitry is a first selection circuitry and wherein the apparatus comprises a second selection circuitry coupled to a second data input and a second scan input, wherein an output of the second selection circuitry is coupled to the second flip-flop.

12. The apparatus of claim 10, wherein the master latch of the first or second flip-flop is a high-clock-phase latch, while the slave latch of the first or second flip-flop is a low-clock-phase latch.

13. The apparatus of claim 10, wherein the master latch and the slave latch of the first or second flip-flop have an associated clock path which has at most seven transistors in the master and slaves latches.

14. An system comprising:
a memory;
a processor coupled to the memory, the processor including a flip-flop which comprises:
a master latch comprising a keeper controllable by a clock input, wherein the keeper of the master latch is coupled to a memory circuitry of the master latch; and
a slave latch coupled to an output of the master latch, wherein the slave latch comprises a keeper controllable by an inverse of the clock input, wherein the keeper of the slave latch is coupled to a memory circuitry of the slave latch, wherein the slave latch comprises a footer controllable by the inverse of the clock input, and wherein the footer of the slave latch is coupled to a memory circuitry of the slave latch; and
a wireless interface to allow the processor to communicate with another device.

15. The system of claim 14 comprises a display to display contents processed by the processor.

16. The system of claim 14, wherein the master latch comprises a footer controllable by the clock input, wherein the footer is coupled to the memory circuitry via a device.

17. The system of claim 14, wherein the master latch comprises an inverter coupled to a data input, wherein the inverter is to provide a skewed input-to-output delay.

18. The system of claim 14, wherein:
the keeper of the master latch is to provide a controllable power supply to the memory circuitry of the master latch; and
the keeper of the slave latch is to provide a controllable power supply to the memory circuitry of the slave latch.

19. The system of claim 14, wherein the master latch and the slave latch have an associated clock path which has at most seven transistors in the master and slaves latches, and wherein the master latch is a high-clock-phase latch, while the slave latch is a low-clock-phase latch.

\* \* \* \* \*